US008060325B2

(12) United States Patent
Lambert (10) Patent No.: US 8,060,325 B2
(45) Date of Patent: Nov. 15, 2011

(54) VARIABLE SENSING USING FREQUENCY DOMAIN

(75) Inventor: Rodney J. Lambert, Lansing, MI (US)

(73) Assignee: 2 Bit, Inc., Lansing, MI (US)

( * ) Notice: Subject to any disclaimer, the term of this patent is extended or adjusted under 35 U.S.C. 154(b) by 39 days.

(21) Appl. No.: 11/938,517

(22) Filed: Nov. 12, 2007

(65) Prior Publication Data

US 2008/0114557 A1    May 15, 2008

Related U.S. Application Data

(60) Provisional application No. 60/858,970, filed on Nov. 14, 2006.

(51) Int. Cl.
*G01R 11/46* (2006.01)
*G01R 29/08* (2006.01)
*G01R 19/252* (2006.01)
*G01N 21/25* (2006.01)

(52) U.S. Cl. ............... 702/66; 702/73; 702/76; 702/81

(58) Field of Classification Search ............... 702/66, 702/77, 94, 116, 141, 142, 150, 182, 188, 702/189; 73/587, 646; 235/440; 725/18
See application file for complete search history.

(56) References Cited

U.S. PATENT DOCUMENTS

| 4,956,999 | A * | 9/1990 | Bohannan et al. | 73/587 |
| 5,945,932 | A * | 8/1999 | Smith et al. | 341/51 |
| 6,155,488 | A * | 12/2000 | Olmstead et al. | 235/440 |
| 7,142,705 | B2 * | 11/2006 | Inoue et al. | 382/132 |
| 7,284,255 | B1 * | 10/2007 | Apel et al. | 725/18 |
| 7,401,519 | B2 * | 7/2008 | Kardous | 73/646 |

* cited by examiner

*Primary Examiner* — Mohamed Charioui
*Assistant Examiner* — Felix Suarez
(74) *Attorney, Agent, or Firm* — Young Basile (57) ABSTRACT

Embodiments of a method and apparatus for variable sensing using the frequency domain are taught herein. An exposure of a system to a physical variable is determined by periodically sensing the physical variable to produce a plurality of digital samples. The plurality of digital samples is converted to respective frequency domain representations. The exposure is calculated using the frequency domain representations.

23 Claims, 6 Drawing Sheets

VARIABLE SENSING USING FREQUENCY DOMAIN

CROSS-REFERENCE TO RELATED APPLICATION

This application claims the benefit of U.S. Provisional Application Ser. No. 60/858,970, filed Nov. 14, 2006.

FIELD OF THE INVENTION

The present invention relates, in general, to sensor devices monitoring variables and, more particularly, to a sensor device using the frequency domain for analysis.

DESCRIPTION OF THE RELATED ART

Data acquisition systems that obtain information with respect to one or more measured variables are known. These systems are usually custom-designed for the application.

SUMMARY

One method for monitoring an exposure of a system to a physical variable taught herein comprises periodically sensing the physical variable to produce a plurality of samples, converting the plurality of samples to respective frequency domain representations and calculating the exposure using the frequency domain representations.

Other methods and various additional features of the invention are taught as described in more detail hereinafter.

BRIEF DESCRIPTION OF THE DRAWING

The various features, advantages and other uses of the present invention will become more apparent by referring to the following detailed description and drawing in which.

DETAILED DESCRIPTION

Embodiments of the sensor are highly configurable and sample a physical variable such as acceleration, voltage, temperature, or the output of some other raw sensing element. The sensor may also sample multiple channels simultaneously; acceleration in x, y, and z orthogonal directions, for example. The physical variable is converted to a low voltage electrical signal, which is conditioned and converted to a digital stream of data with an analog-to-digital converter.

The digital data stream is converted via a continuous series of Fourier transforms into frequency domain representations of the sensed physical variable. Calibrations are then applied to the data to remove frequency dependency of the sensing element and artifacts introduced by the signal conditioning and to achieve a known sensitivity in the data. Next, an algorithm is applied to the data to report exposure of the system being monitored. For example, instantaneous, recent or lifetime exposure can be determined. The result of the algorithm can then be either sent to a digital-to-analog converter (as logic level or a proportional value), or it can be sent to a communication bus for transmission to another application. For example, the output can be used to trigger recording of data, to give a measure of importance to data or to signal alarm(s). The output can also be used as part of a control loop.

Figure 1:
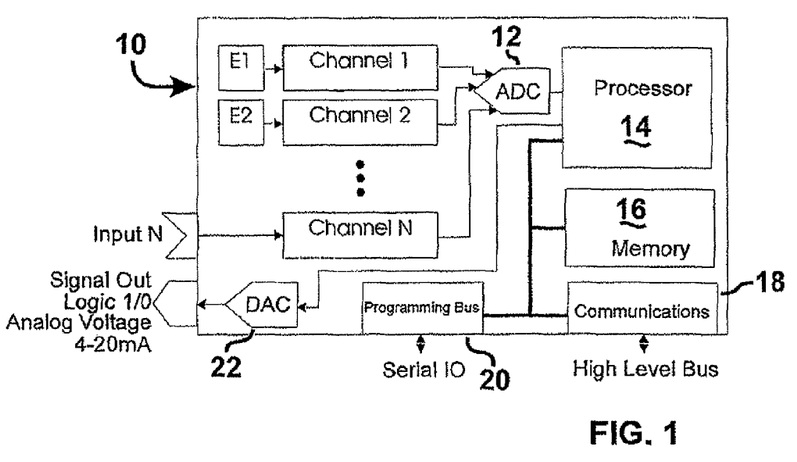
FIG. 1 is a functional block diagram of a sensor in accordance with one embodiment of the invention.

Various features of the invention can be further explained with reference to FIGS. 1-7. Referring to FIG. 1, the hardware of the sensor 10 includes N channels of sensory input and signal conditioning for the inputs. The source of each sensory input signal can be a sensing element within the body of the sensor 10, or it can be a source external of the sensor 10. For example, in the embodiment shown, signals E1 and E2 represent signals from an accelerometer within the sensor 10 body, while Input N indicates the existence of external signal sources. Each channel, Channel 1, Channel 2, . . . Channel N, includes amplification and anti-aliasing filters to condition the respective sensory input signals before digitizing through the analog-to-digital converter (ADC) 12.

The digitized sensory inputs are supplied to a processor 14 with memory 16. The processor 14 can be a microprocessor coupled to external memory, or a microcontroller with integrated memory. The processor 14 can also be, for example, an application-specific integrated circuit (ASIC), digital signal processor (DSP), or the equivalent that performs the operations as described below. Also, the functionality of each of the Channels 1, 2 . . . N and the ADC 12 can be integrated with the processor 14.

The processor 14 and memory 16 are coupled to a high level bus through a communications interface 18 using a standard wired or wireless communications protocol, such as USB, CAN, RS232, FireWire, Bluetooth, etc. The communications interface 18 is a bidirectional communications bus that can be used to configure the sensor 10, get the current output from the processor 14 and retrieve recorded data from memory 16. The processor 14 is configured for its application and environment using software running on a personal computer (PC), workstation or server. The PC, workstation or server programs the processor 14 through a serial input-output (IO) connection to a programming bus 20 of the sensor 10. The serial IO can also be used to calibrate the sensor and may be JTAG or a processor-specific serial bus. The sensor 10 software and calibration are stored in nonvolatile memory 16 to allow stand-alone operation storage. In an effort to reduce memory usage, and to overcome the difficulty of providing the large number of configuration parameters, the software can interpolate between a small set of control points or analyze a data set for operational limits.

Although not shown, external power is provided to the sensor 10 when it is not running on an internal power supply. The sensor 10 is also grounded, which provides a reference voltage.

As mentioned above, output from the processor 14 can be sent over to another application through the communications interface 18. The output can also be sent through a digital-to-analog converter (DAC) 22. This DAC 22 converts the digital output signal from the processor 14 and/or memory 16 into an output signal, SignalOut. As shown in FIG. 1, SignalOut can be an analog value switched from zero to full scale to provide logic levels 1/0 (indicating, for example, a value over a threshold or under a threshold) or a proportional analog value (indicating, for example, the system's current state within the operational envelope). Depending upon the mode of operation, SignalOut can be instantaneous, recent or lifetime exposure. The output may be the single highest channel or a weighted value of all of the channels.

According to the sampling methodology possible with the sensor 10, digitized data from each of Channels 1, 2, . . . N is fed into overlapping windows to avoid destroying key features in the signal due to the window function Γ. The window function Γ is application specific or a standard window function, such as Hanning, Triangular, etc., that is essentially an array of scalars applied to each window to make non-stationary data appear stationary. Conventionally, data is assumed to be cyclical, that is, the ending point of a window and the starting point of the next window are assumed to be continuous. Window functions are applied to time domain data before the conversion to the frequency domain (as discussed in more detail below) because a large difference in the starting point and the ending point would result in noise. Hence, the scalars applied generally minimize the values at the start and end of the window and use only the full measured data point towards the center as shown in the curves of FIG. 2.

However, actual data is not typically cyclical with the exact same period as the window period, and the window function can cause this fact to be lost. Using overlapping windows means that data minimized at the start and end of a window are still accounted for as the data is also used to populate the central area of another window. Overlapping windows means that for data sampling more than two arrays per channel are assigned, and at least two of these arrays are receiving data while another is being processed. For example, three arrays for data can be assigned per channel such that at any time two arrays are receiving data, and the third is being processed. This example is illustrated in FIG. 2.

Figure 2:
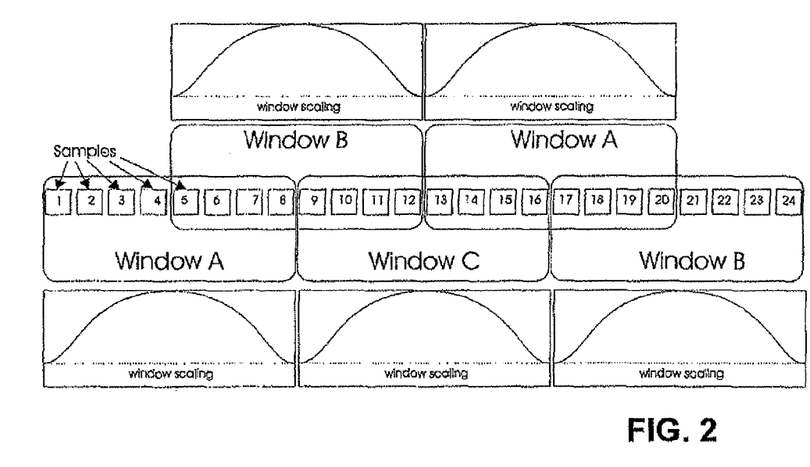
FIG. 2 is a graphical illustration of overlapped windowing with a window length of eight (8) samples.

In FIG. 2, the channel shown has three windows, Window A, Window B and Window C, and each window includes eight samples. Data Samples 5-8 are sequentially placed in Window A and Window B. When Sample 8 is saved to memory 16, processing as described in more detail hereinafter begins on Window A. When Sample 9 is saved, Window C is used in addition to Window B. That is, Sample 9 is saved in both Window B and Window C. Processing of Samples 1-8 in Window A must be complete prior to Sample 13 because Window A is needed again for accepting data Samples 13-20. FIG. 2 thus illustrates that one half of the window period is available for any necessary processing. In this manner, no sample is completely discounted by the window function because data stored near the end of one window is also near the middle of another window. This buffering also provides the additional benefit of doubling the output update rate of the sensor output, such as SignalOut, to every (window period/2) seconds. Of course, the number of windows and the window size (e.g., 8, 16, 32, etc., samples) can vary and is set by the sensor configuration.

The samples as described above, such as Samples 5-8, are each read from the ADC 12 and are scaled by the processor 14 prior to storage in memory 16. Each is scaled with reference to their positions within the windows in which they are to be stored. For example, the digitized data to be stored as Sample 13 is scaled by one factor corresponding to its position early in Window A and is scaled by a second factor corresponding to its position later in Window C prior to being saved in each of the respective windows. Mathematically, this is represented by the following:

$$X_a[i] = \Gamma[i] \cdot X_{t+i}; \text{ and}$$

$$X_b\left[i - \frac{\Lambda}{2}\right] = \Gamma\left[i - \frac{\Lambda}{2}\right] \cdot X_{t+i} \text{ if } \frac{\Lambda}{2} < i \leq \frac{3\Lambda}{2}; \text{ or}$$

$$X_c\left[\frac{\Lambda}{2} + i\right] = \Gamma\left[\frac{\Lambda}{2} + i\right] \cdot X_{t+i} \text{ if } -\frac{\Lambda}{2} < i \leq \frac{\Lambda}{2}; \text{ wherein}$$

$\Lambda$ is the window length or number of samples in a window where $0 < i \leq \Lambda$;

t is the time when window A started;

$X_{t+i}$ is the measured variable at $t+i \cdot dt$;

$X_a[i]$ is the value of measured variable at sample position i in Window A;

$\Gamma[i]$ is the window function scaler applied to the measured variable at sample position i in Window A;

$$X_b\left[i - \frac{\Lambda}{2}\right]$$

is the value of the measured variable at sample position $i-\Lambda/2$ in Window B;

$$\Gamma\left[i - \frac{\Lambda}{2}\right]$$

is the window function scaler applied the measured variable $X_{t+i}$ at sample position $i+\Lambda/2$ in Window B;

$$X_c\left[\frac{\Lambda}{2} + i\right]$$

is the value of the measured variable at sample position $\Lambda/2+i$ in Window C; and $$\Gamma\left[\frac{\Lambda}{2} + i\right]$$

is the window function scaler applied to the measured variable $X_{t+i}$ at sample position $\Lambda/2+i$ in Window C.

Once a window such as Window A is full, a Fourier Transform is performed on the window to convert the data from the time domain to the frequency domain according to the following:

$$C_k = \frac{1}{\Lambda} \sum_{i=0}^{\Lambda-1} X[i] e^{-j2\pi ki/\Lambda}; \text{ wherein}$$

$C_k$ is a complex Fourier coefficient at a particular radial frequency k for the variable $X[i]$; and $X[i]$ is a value of measured variable at any particular sample position i in the time-domain window. This operation is performed over $k=0, 1, \ldots, \Lambda-1$ to provide an array of complex values.

Calibration numbers are then applied to these coefficients according to:

$$\Phi_k = |C_k|^2 \cdot S_k; \text{ wherein}$$

$\Phi_k$ is a calibrated power magnitude for a particular frequency k;

$|C_k|^2$ is power at the frequency k; and $S_k$ is the calibration scaler for the frequency k.

This operation is performed for each of the coefficients $C_k$ of the array. The calibration scalars are used to set the sensitivity to a desired level, to remove any ripple of the filters in the pass band and to correct for any attenuation in power due to the window function. A single value can also be applied to the computed power in certain applications, and this would save processing time. For example, if the sensor input has flat frequency response, and the input filters are relatively immune to ripple, then a single value is useful.

Next, the exposure algorithms are discussed. More specifically, the raw sensory input data, once stored in memory 16 and processed by the processor 14, can be used to assess the exposure of the monitored component, person, device, etc., to the sensed variable. Various methodologies can be used to assess the exposure.

One such indication of exposure can be provided by a power spectrum density or power density spectrum (PDS). Conventionally, an average power P can be calculated by summing the power values according to the following:

$$P = \sum_{k=0}^{\Lambda-1} \Phi_k$$

According to the teachings herein, a weighted PDS can be calculated. In such a weighted PDS, each calibrated power magnitude for a particular frequency is scaled based on the relative impact it has on the system being monitored according to the following:

$$P_k = \phi_k \cdot \Phi_k; \text{ and}$$

$$P_\phi = \sum_{k=0}^{\Lambda-1} P_k; \text{ wherein}$$

$P_k$ is the weighted power at frequency k;

$P_\phi$ is the weighted power; and $\phi_k$ is a weighting factor to apply to the calibrated power magnitude for a respective frequency.

The weighting factor can be used, for example, to scale a term in the PDS corresponding to a particular frequency to which the system being monitored is particularly sensitive. For example, exposure to a resonant frequency of a monitored system could be a particularly important measure of stress. It should also be noted that since $S_k$ and $\phi_k$ are both scalars, they can be combined in some cases to reduce the required processing.

Other methods of calculating a weighted exposure are also possible. For example, ISO Standard 2631-1:1997, which is incorporated herein in its entirety by reference, describes a method of evaluating human exposure to mechanical vibration and shock. In that Standard, the mathematical representation of frequency-weighted RMS acceleration $a_W$ is defined as follows:

$$a_W = \left[ \sum_i (W_i a_i)^2 \right]^{1/2}; \text{ wherein}$$

$W_i$ is a weighting factor for the i th frequency band; and $a_i$ is a root-mean-squared acceleration of the i th frequency band.

This formula can also be used as an alternative method to calculate a weighted RMS exposure $P_{RMS}$ according to the formula:

$$P_{RMS} = P_\Phi^{1/2} = \left[ \sum_{k=0}^{\Lambda-1} W_k^2 \Phi_k \right]^{1/2}; \text{ wherein}$$

$\Phi_k$ is a calibrated power magnitude for a particular frequency k;

$P_\Phi$ is the weighted power; and $W_k^2$ is the weighting factor for the i th frequency band.

If an accelerometer is incorporated into the sensor 10 as described briefly above, then that embodiment of the invention performs a measurement of acceleration conforming to the specification where the weighted PDS is a measure of frequency-weighted RMS acceleration $a_W$ as below:

$$a_W = \left[ \sum_{k=0}^{\Lambda-1} \phi_k \Phi_k \right]^{1/2}; \text{ wherein}$$

$\phi_k = W_k^2$ and may include any constants as needed.

Another indication of exposure is a profile maximum peak. In this method of determining exposure, each calibrated power magnitude for a particular frequency k, $\Phi_k$, is compared to a threshold, and the output is in the form of a logical value or a proportional value for output through communications interface 18, through the DAC 22 to SignalOut or to memory 16. This comparison is shown below:

$$\varepsilon_k = \begin{cases} 1 & \Phi_k \geq M_k \\ 0 & \Phi_k < M_k \text{ Logical Mode} \\ \frac{\Phi_k}{M_k} & \Phi_k < M_k \text{ Analog Mode}; \end{cases}$$

wherein $\varepsilon_k$ is the instantaneous exposure at frequency k;

$M_k$ is the upper threshold level for $\Phi_k$.

Then, $\varepsilon = \text{MAX}(\varepsilon_k)$ for k=0, ..., $\Lambda-1$; wherein $\varepsilon$ is the instantaneous exposure for the window.

Hence, when the sensor 10 is operating in logical mode, such that the output is a logic 1/0 as described initially, an exposure at or above the threshold sets the output value to logic 1, while an exposure below the threshold results in setting the output value to logic 0. Similarly, when the sensor 10 is operating in analog mode, an exposure at or above the threshold sets the output value to 1, while an exposure below the threshold sets the output value to a fraction that represents the exposure as a fraction of the threshold.

The output of each comparison can be maintained. Alternatively, to minimize requirements for the memory 16, the instantaneous exposure $\varepsilon_i$ for each window i can be set to the maximum of all of the values obtained by the comparison at each frequency in that window. For example, if no calibrated power magnitude exceeds the threshold for a window, all of the data in that window can be discarded as the maximum value of the instantaneous exposure $\varepsilon_i$ for the window based on all of the comparisons would not equal 1.

Another method of determining exposure is the use of an envelope algorithm. Basically, an envelope algorithm uses an upper profile M and a lower profile m and verifies that each $\Phi_k$ falls between $m_k$ and $M_k$. A number of outputs are possible in the comparison. As one example, shown below the instantaneous exposure provides an output, such as logic 1, whenever $\Phi_k$ is outside of the level. As in the description above, each of the calibrated power magnitudes $\Phi_k$ is compared to a value in the upper profile and the lower profile specific to the frequency k to obtain an instantaneous exposure at frequency k:

$$\varepsilon_k = \begin{cases} 0 & m_k \leq \Phi_k \leq M_k \\ 1 & \Phi_k < m_k \\ 1 & \Phi_k > M_k; \end{cases}$$

wherein $M_k$ is the upper threshold level for $\Phi_k$; and
$m_k$ is the lower threshold level for $\Phi_k$.

The instantaneous exposure $\varepsilon_i$ over an entire window i is 1 if any value $\varepsilon_k$ is 1, and i is 0 otherwise. Accordingly, the appropriate output signal can be sent for each window. This output, like the output for the profile maximum peak, can be used as a trigger for another process, etc.

Exposure may also be measured by a pattern matching technique that compares a user defined PDS pattern to the measured PDS via a correlation function such as the standard correlation function below:

$$S_{xx} = \sum_{k=0}^{\Lambda-1} \phi_k^2 - \frac{\left(\sum_{k=0}^{\Lambda-1} \phi_k\right)^2}{\Lambda};$$

wherein $\phi$ represents the user defined values;

$$S_{yy} = \sum_{k=0}^{\Lambda-1} \Phi_k^2 - \frac{\left(\sum_{k=0}^{\Lambda-1} \Phi_k\right)^2}{\Lambda};$$

wherein $\Phi$ represents the measured values;

$$S_{xy} = \sum_{k=0}^{\Lambda-1} \phi_k \cdot \Phi_k - \frac{\sum_{k=0}^{\Lambda-1} \phi_k \cdot \sum_{k=0}^{\Lambda-1} \Phi_k}{\Lambda}; \text{ and}$$

$$\hat{\varepsilon} = \frac{S_{xy}}{\sqrt{S_{xx} \cdot S_{xy}}}; \text{ wherein } -1 \leq \hat{\varepsilon} \leq 1.$$

When using communications bus 18 to signal the exposure the full numerical range is allowed. Therefore the exposure may take on the value $\varepsilon = \hat{\varepsilon}$. However, when the exposure is expressed via the SignalOut it may be desirable to have the exposure defined by one of the following:

$$\varepsilon = \begin{cases} 0 & \hat{\varepsilon} < 0 \\ \hat{\varepsilon} & \hat{\varepsilon} \geq 0 \end{cases} \text{ or } \varepsilon = \frac{\hat{\varepsilon}+1}{2}$$

when a high exposure corresponds to a high correlation or $$\varepsilon = \begin{cases} 1 & \hat{\varepsilon} < 0 \\ 1-\hat{\varepsilon} & \hat{\varepsilon} \geq 0 \end{cases} \text{ or } \varepsilon = 1 - \frac{\hat{\varepsilon}+1}{2}$$

when a high exposure corresponds to a low correlation.
Thus the output can be determined as follows:

$$\text{Output} = \begin{cases} \varepsilon & \text{Analog Mode} \\ 0 & \varepsilon < \text{threshold} \quad \text{Digital Logic Mode} \\ 1 & \varepsilon > \text{threshold} \quad \text{Digital Logic Mode} \end{cases}$$

This technique is yet another way in which the sensor 10 can provide a valuable output regarding exposure.

In addition to the foregoing techniques, the sensor 10 can also configure multiple channel sensors. For example, the highest single channel output from multiple channel sensors can be used as SignalOut for the sensor 10, or a weighted channel resultant output can be used as SignalOut. For example, using an accelerometer with three channels reflecting motion in the x, y and z directions, a weighted channel resultant output R is calculated according to the following:

$$R = (k_x out_x^2 + k_y out_y^2 + k_z out_z^2)^{\frac{1}{2}}; \text{ wherein}$$

$out_x$, $out_y$, and $out_z$ are outputs from the processor 14 associated with data from respective inputs of the accelerometer; and $k_x$, $k_y$, and $k_z$ are respective weighting factors to be applied to $out_x$, $out_y$, and $out_z$. $Out_x$, $out_y$, and $out_z$ could be, for example, the results of any of the processing discussed herein, such as $\Phi_k$, P, $P_\phi$, $a_W$, $\epsilon$, etc.

The sensor 10 can also suppress or emphasize frequencies based on the fundamental, even as the fundamental changes frequency. For example, the fundamental, being large and a result of normal operations, may not be of interest, but small harmonics may be of interest. A self-synchronized technique is used for analyzing frequencies based on the fundamental frequency. This technique assumes that the highest amplitude technique can be used as the fundamental frequency of the system, represented by f=k of max($\Phi$). That is, the fundamental frequency f corresponds to the frequency number k for the calibrated power magnitude $\Phi_k$ that has the highest amplitude peak of all of the calibrated power magnitudes $\Phi$. A profile array contains scalars applied to all calibrated power magnitudes $\Phi_k$ associated with each frequency, depending upon whether that frequency is non-harmonic, is the fundamental frequency or is a harmonic frequency, wherein:

$C_0$ is the scalar for all non-harmonic frequencies;
$C_1$ is a division factor where $k/C_1$ is the actual fundamental frequency;
$C_2$ is the scalar for the fundamental frequency; and
$C_h$ is the scaler for harmonic h−2 as harmonic h>2.
For example:
$C_0$=1.0 scales all non-harmonic frequencies by 1.0;
$C_1$=3.0 means that the fundamental frequency is f/3.0;

$C_2=0.0$ scales the fundamental frequency by 0.0;
$C_3=0.0$ scales the first harmonic by 0.0;
$C_4=0.0$ scales the second harmonic by 0.0;
$C_5=1.0$ scales the third harmonic by 1.0;
$C_{N-1}=1.0$ scales all other harmonics by 1.0.

In this example the fundamental frequency and the first two harmonics are removed from the calculation of the exposure, and all other frequencies are weighted equally.

A similar methodology is a cross synchronization approach. This approach uses one channel to determine the fundamental frequency, and then synchronizes to another channel. For example, given Channels A, B, C and D, where Channels A, B and C are inputs from an accelerometer, Channel D could be connected to receive input from a magnetic sensor indicating rotations of a shaft. The fundamental frequency is then determined by finding the frequency that contains the maximum power on Channel D. The frequency is then used to align the scalar constants to the other channels, and the process proceeds as in the self synchronized method.

The instantaneous exposure $\epsilon$, or the exposure per window period, has been previously discussed. The quantity recent exposure E is the sum of micro exposures $\mu_n$, which are in turn sums of instantaneous exposures $\epsilon_i$. More specifically, the micro exposures are calculated according to:

$$\mu_n = \frac{\sum_{i=0}^{\Xi} \varepsilon_i}{S_W}; \text{ wherein}$$

$\Theta$ is the micro exposure period, or the number of windows to sum and should be a multiple of $S_W$;
$S_W$ is the number of windows running simultaneously;
$\epsilon_i$ is the instantaneous exposure for a window i; and
$\mu_n$ is a micro exposure.
The recent exposure is defined as:

$$E_\Psi = \sum_{i=0}^{\Psi-1} \mu_i$$

The micro exposure period $\Theta$ defines the resolution of the recent exposure E. For example, if it is desired to have exposure times of at least one minute, and the window period $\Delta$ is 0.1024 seconds, a useful value for the micro exposure period $\Theta$ is 1172. Because there are two windows running simultaneously, the resolution of the recent exposure E is $(\Theta*\Delta)/2=(0.1024 \text{ sec}*1172)/2=60.0064$ seconds.

Figure 3:
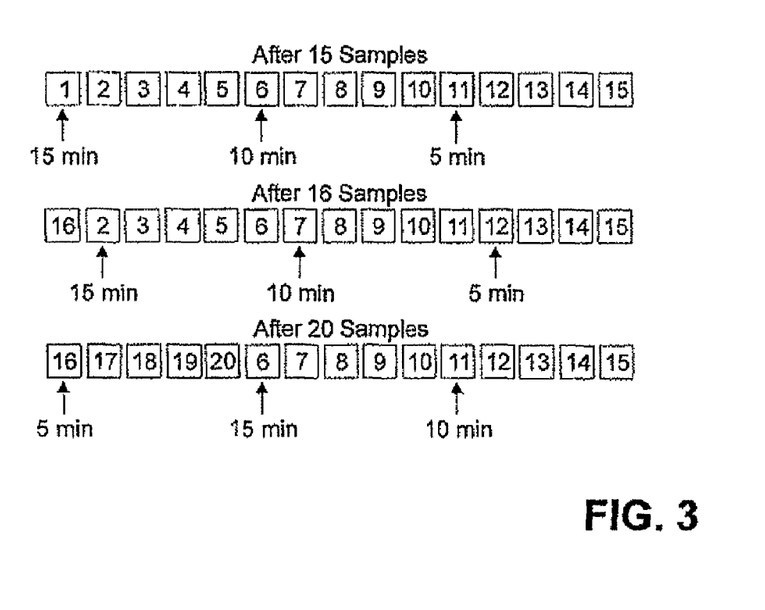
FIG. 3 is a graphical illustration of a recent exposure buffer for 15, 10 and 5-minute exposures.

This calculation of recent exposure E requires a rotating buffer of N elements so that data is not lost. More specifically, in this described implementation, after each micro period $\Theta$, the new micro exposure $\mu_i$ overwrites the oldest micro exposure $\mu_{i-N}$ in the array. The new exposure E is calculated by summing the elements of the array. In the example above, the micro period is set to 60.0064 sec. As shown in FIG. 3, assuming that recent exposures of 5, 10 and 15 minutes are desired, a buffer of 15 elements is needed. The three sums are calculated for each of the exposures to determine exposure levels. The sensor 10 can report the highest level, whether any of the exposures are above the threshold, or can report each of the exposure levels.

So far, the effect of the noise floor on the accumulation of exposure has not been addressed. Each analog system has some output, i.e., noise, unrelated to the physical variable being measured. The noise signal becomes part of the instantaneous exposure. For most applications this noise is small enough compared to the signal of interest that the noise does not significantly effect the output. However, where the sensor 10 starts accumulating thousands of instantaneous exposures $\epsilon$, like here, the noise can sum to a value large enough to hide small signals. Thus, when calculating recent exposure noise is subtracted from each of the instantaneous exposures $\epsilon$. The value used for this calculation is obtained by calibration. For example, an operator can perform calculations using actual data and a predetermined disturbance or sequence of disturbances to the monitored system and compare that to a mathematical representation of the disturbance or sequence of disturbances. In addition, this value may includes levels that are not considered to contribute to the exposure.

Figure 4:
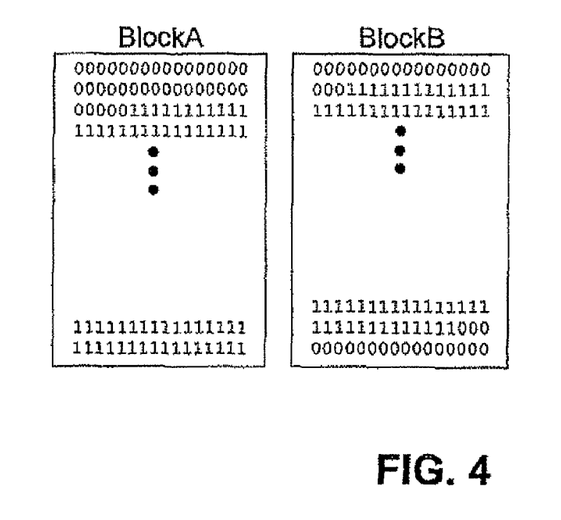
FIG. 4 illustrates non-volatile memory used to track lifetime exposure.

The calculation of lifetime exposure is next described. The sensor 10 sums instantaneous exposures $\epsilon$ until the sum exceeds a predetermined threshold. Once the sum exceeds the threshold, the threshold is subtracted from the sum, and the occurrence is recorded to non-volatile memory. The total number of these occurrences is tracked using two blocks of independently erasable non-volatile memory as shown in FIG. 4. One block is used to count individual occurrences of the sum exceeding the threshold while the other keeps track of each time the first block fills. When the threshold is first exceeded, an algorithm of the processor 14 programs the least significant bit of the first word in BlockA to zero, while the algorithm programs the next significant bit of the first word to zero on the second occurrence of exceeding the threshold and so on. After all bits of the first word are programmed to zero, the algorithm moves to the second word and proceeds in the same fashion.

Optionally, the sensor 10 can include an algorithm whereby the sensor 10 on startup can write a predetermined number of exposure units to BlockA. This allows counting of the system power cycles in the exposure, preventing the sensor 10 from under-reporting the exposure.

The sensor 10 could be powered down while BlockA is being erased, resulting in under-counting the true exposure. For this reason, two bits in BlockB track the number of times BlockA has been filled. Before erasure of BlockA begins, the algorithm changes the highest logic one bit to a logic zero. When the erasure is complete, the algorithm changes the lowest logic one bit to zero. This easily allows for detection upon sensor 10 startup as to whether the sensor 10 was in the midst of an erasure of BlockA when it powered down. Essentially, more zeros are detected at the top of BlockB than at the bottom of BlockB. This situation is corrected by erasing BlockA writing a zero to the bottom of BlockB when start up is completed.

Output of the sensor 10 in analog mode is the ratio between the current cumulative exposure and a maximum lifetime threshold value. In digital logic mode, the output is zero as long as the threshold has not been exceeded, and 1 once the maximum lifetime threshold value is exceeded. In bus mode, the current cumulative exposure in a signal conforming to the protocol of communication bus 18 is possible. Hence, a comprehensive method for evaluating wear on the monitored system is provided.

The sensor 10 can be used as part of a recorder. For example, instantaneous exposure results can trigger recording of the data used to measure the exposure or other data streams when, for example, the instantaneous exposure exceeds a threshold. An instantaneous exposure may also be used to determine the relevance of previously-recorded data. For example, data associated with large exposure may replace data associated with a lesser exposure since it is assumed to be of greater importance. Further, one may choose not to record the raw data collected and instead save only the instantaneous exposures. Alternatively, histograms of instantaneous exposures over specific time frames can be saved to allow a recorder with limited memory to record over long periods of time while characterizing the environment of the system monitored.

Also, instead of using instantaneous exposure E, recent exposure E can be used. For example, a whole body vibration profile such as that described in ISO 2631-1:1997 can be included in the recorder. Either the instantaneous exposures or a cumulative exposure can be recorded for later analysis.

Memory allocation is next discussed in that it is desirable to use volatile and non-volatile memory so as to allow data locations that need to change frequently to be placed in volatile memory while less-frequently changed data is directed to non-volatile memory. Accordingly, when recording data the N most relevant events are stored, while less significant events are continuously overwritten. At intervals, optionally user-defined, the stored relevant events are moved from volatile to non-volatile memory. This provides a backup for the data and additionally frees space in volatile memory. Also, in the event that recording progresses to a point where non-volatile memory is significantly reduced, the most significant events can be grouped in non-volatile memory in blocks. The blocks that they are taken from are then erased. Hence, even in the event of power loss, the most relevant events are saved in memory.

Thus is provided a sensor capable of measuring exposure to time varying physical quantities. Instantaneous, recent and lifetime exposure can be reported by the sensor in digital logic and/or an analog voltage output. Also, this information can be reported on a data bus for transmittal to peripheral equipment. Applications in which the sensor can be incorporated include process/machine control, alarm signals, triggering the recording of data, assigning importance to recorded data, measuring thermal fatigue or whole body vibration, voltage monitoring. etc. Simply put, the sensor measures some real variable like acceleration, temperature or strain. The sensor then processes the data into the frequency domain and performs calculations to determine the exposure to that physical variable. Using its memory, the sensor can retain a recent history and a lifetime history.

Certain examples describing possible uses of the sensor 10 are next described, followed by detailed descriptions of three possible uses.

When used in machine control, the sensor 10 can allow a machine to operate within allowed limits while maintaining a high throughput. For example, assume that a machine is designed to grind or crush course material into small pieces. Such a machine produces a great deal of vibration, but certain modes of vibration indicate an excessively high material feed rate. It is known what level of vibration at each frequency the machine can tolerate. The sensor 10 can be set up with inverse weighting in the weighted RMS mode. In this case, the sensor 10 could output a signal showing the instantaneous exposure for use in a control loop to regulate the feed rate.

Another example is in whole body vibration. The human body has varying degrees of sensitivity to different frequencies. Exposure time is also relevant to any measure of physical damage. The sensor 10 can be used to measure the vibration to which an individual is exposed and to compare that level to industry standards of exposure. The standards specify a frequency profile that is the maximum that a typical human can be exposed to for 10 minutes, 30 minutes and 1 hour before becoming uncomfortable. Hence, the sensor can sum instantaneous exposure, keeping track of the exposure of the last relevant time periods to output the highest value. If the individual is approaching an exposure threshold, such as their 30 minute exposure threshold, an alarm can be sounded with the output of the sensor 10 so that the activity can be stopped before harm results.

As described above, the sensor 10 can record data using its memory. The recording process can be triggered, for example, by looking at an exposure figure. If that figure exceeds a preset level, the data used to determine the exposure and other data streams can be saved to memory to preserve a record of the event. Recording may also be triggered by exceeding a trigger profile defined in the frequency domain, departing from an envelope in the frequency domain or pattern matching in the frequency domain. Since in each case the sensor develops an exposure or correlation figure, this figure number can be used to determine which events are more relevant to allow overwriting of lesser events.

Thermal fatigue is another area in which the sensor 10 can be used. Many materials are susceptible to damage by a process known as thermal fatigue, which is caused by the creation of mechanical strain due to thermal gradients within the material. This mechanical strain eventually results in micro- and macro-fractures, weakening the structure. This can be a problem in, for example, solid fuel rocket motors. Due to the deteriorated material the fuel may not burn in the prescribed manner, possibly resulting in lower performance or other unexpected effects.

For each type of material and geometry of an object there would exist different thermal cycles that have greater impact on the fatigue process. The sensor 10 would sample the temperature surrounding the object and be programmed with the profile that matches the susceptibility of the object monitored. The exposure to thermal cycles can be accumulated over the lifetime of the object being monitored, allowing one to determine if the object has exceed an allowable threshold. In the case of the rocket, for example, one would most likely choose not to launch if the exposure exceeds that threshold.

There are many situations where an indication that something is about to exceed a level are needed. For example, satellites and other high value products have strict guidelines detailing the frequency and level of vibration that they can tolerate. The sensor 10 can be programmed to reflect the requirements and monitor the object during shipment. If a threatening level is approached the output of the sensor can trip an alarm to warn of the condition.

Figure 5:
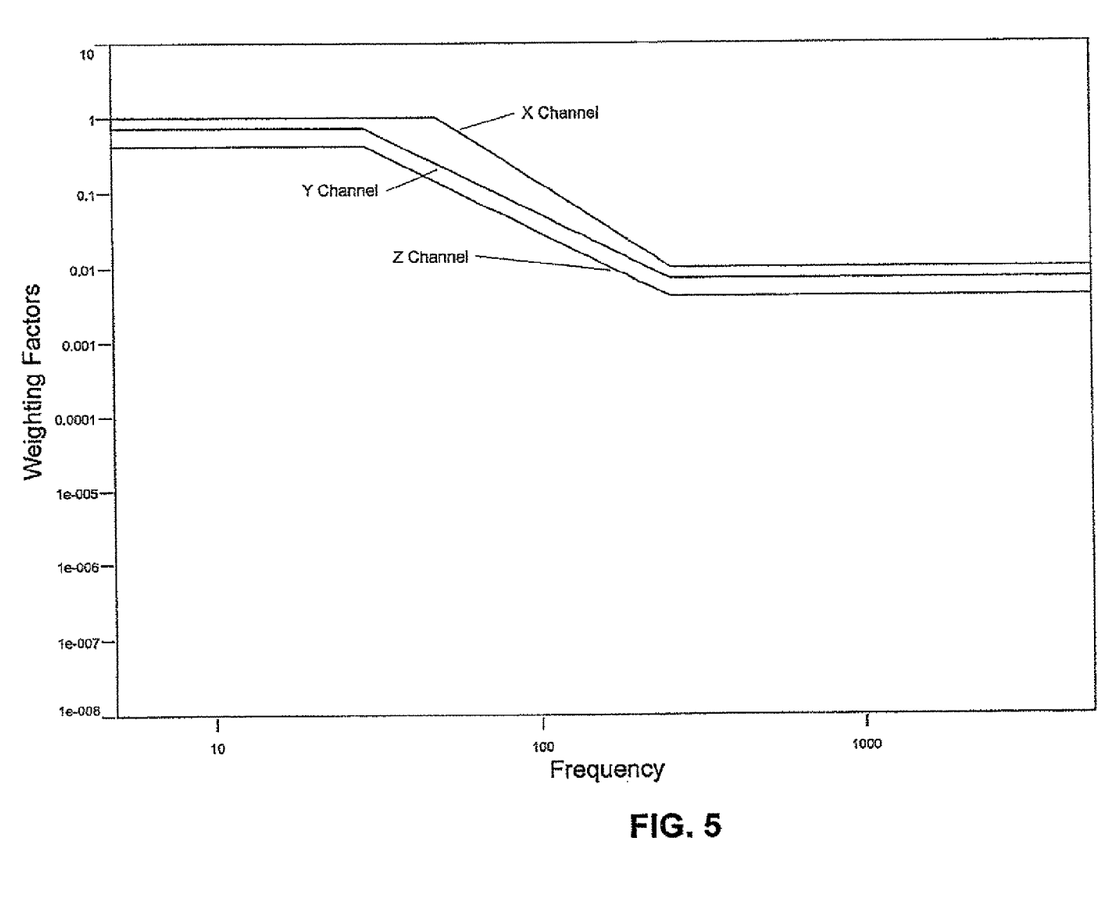
FIG. 5 is a graph showing the weighted RMS profile for hypothetical satellite shipment monitoring on three channels.

Two typical cases in which the sensor 10 can be used are next discussed. The first example is illustrated in FIG. 5. An assumption is made that a communications satellite is to be transported 2000 miles from an assembly plant to a launch location. Although the satellite is designed to survive the vibrations of launch, it is sensitive to particular frequencies. In this case, for example, any vibration greater than 1/10th the amplitude the satellite is designed to survive is selected for recordation. Also, real time notification of any vibration greater than half the design limit is desired. The sensor 10 uses inputs from an accelerometer, and the weighted RMS algorithm described previously is selected as the satellite has varying degrees of susceptibility to different frequencies.

FIG. 5 shows the weighting factors as a function of frequency for each of the three channels of the accelerometer of the sensor 10. These profiles are examples only. Each of the channels is respectively associated with an x, y and z-axis acceleration. In the example of FIG. 5, the acceleration along the x-axis is aligned with the direction of highest sensitivity, and thus the weighting factors give vibrations in this direction the most effect on the output of the sensor 10. The most important frequencies in all axes are below 50 Hz.

Figure 5A:
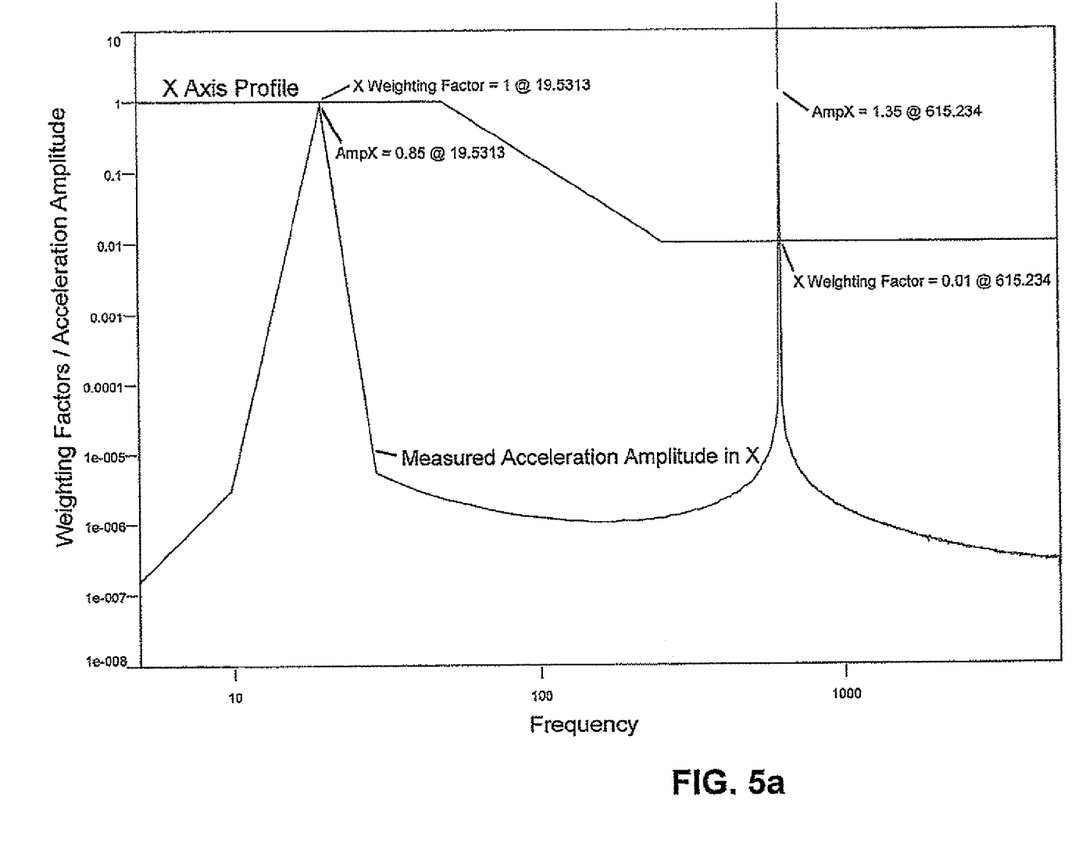
FIG. 5a is a graph showing the weighted RMS profile for hypothetical satellite shipment monitoring of one channel with sample data superimposed.

Using FIG. 5*a* in an example of the calculations, the weighted RMS can be calculated for a 0.85 g amplitude vibration at 19.5313 Hz and a 1.35 g amplitude vibration at 615.234 Hz assuming that the levels at all other frequencies are low enough as not to make a significant contribution to the calculation. The weighted RMS for this data would be:

$$a_w \left[ \left(1.0 \cdot \frac{0.85 \text{ g}}{\sqrt{2}}\right)^2 + \left(0.01 \cdot \frac{1.35 \text{ g}}{\sqrt{2}}\right)^2 \right]^{\frac{1}{2}} = 0.6011 \text{ g};$$

wherein division by $\sqrt{2}$ converts the amplitude to the root-mean-square level. Since 0.6010 g is below the threshold of 1.0 g assumed for this example, no alarm would be signaled.

The strength of this technique can be seen when one realizes that if one used the conventional root-mean-square of the acceleration as an indicator of exposure, this data would have signaled an alarm since arm, $a_{rms}$=1.128 g.

Figure 6:
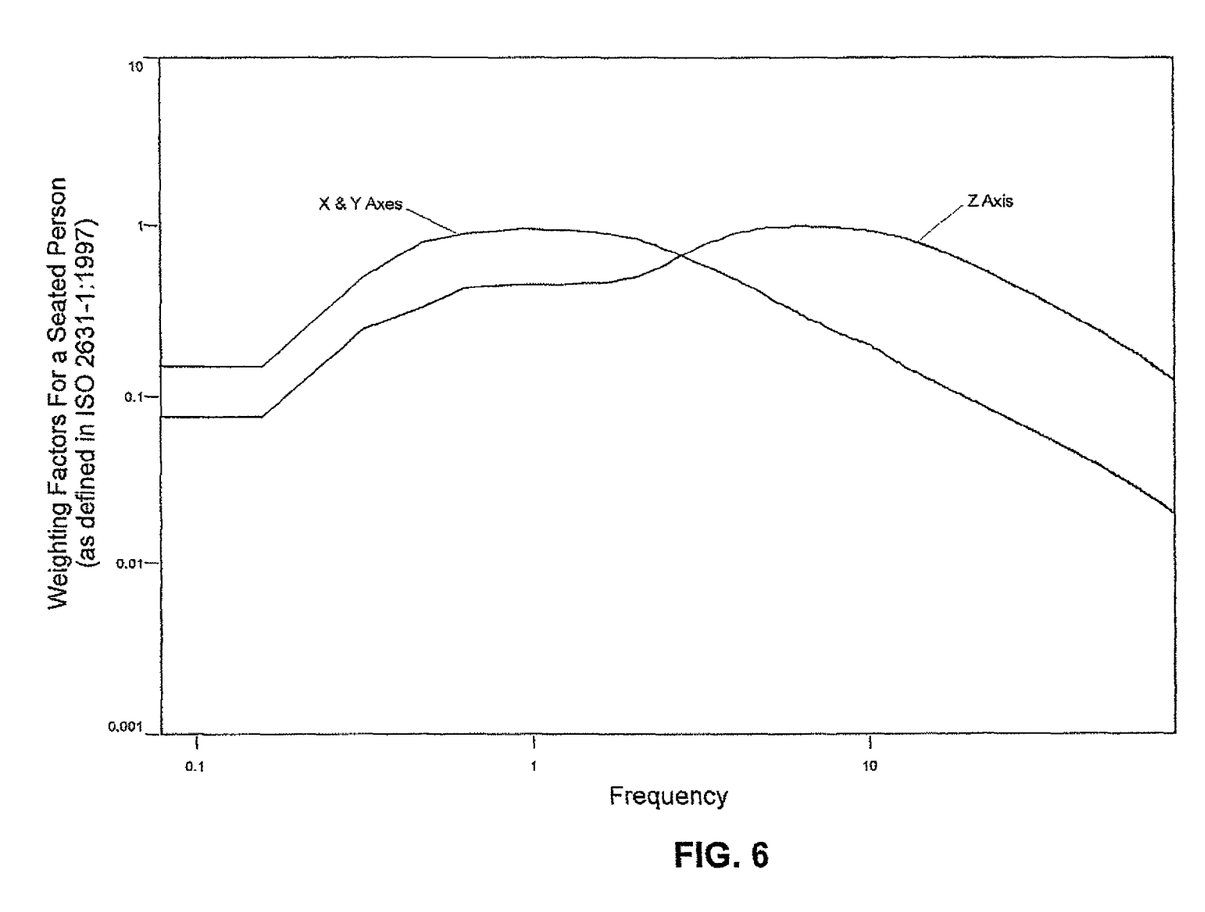
FIG. 6 is a graph showing the weighted RMS profile as defined in ISO 2631-1:1997.

In another example, FIG. 6 provides profiles reflecting weighted RMS as defined in ISO 2631-1:1997. Like FIG. 5, the weighting factors are provided as a function of frequency. The x- and y-axes of acceleration and the z-axis of acceleration are shown. Such information could be used, for example, where a company utilizes a number of lift trucks and wishes to evaluate the exposure to which operators experience during daily operations. Exposure data can be recorded and prioritized using the weighted RMS output. A trigger threshold can be set to signal to a lift operator the existence of a high exposure to vibrations. A combination of recorded activities and real time feedback can be used to, for example, develop programs and/or procedures to reduce vibration exposure.

Figure 7:
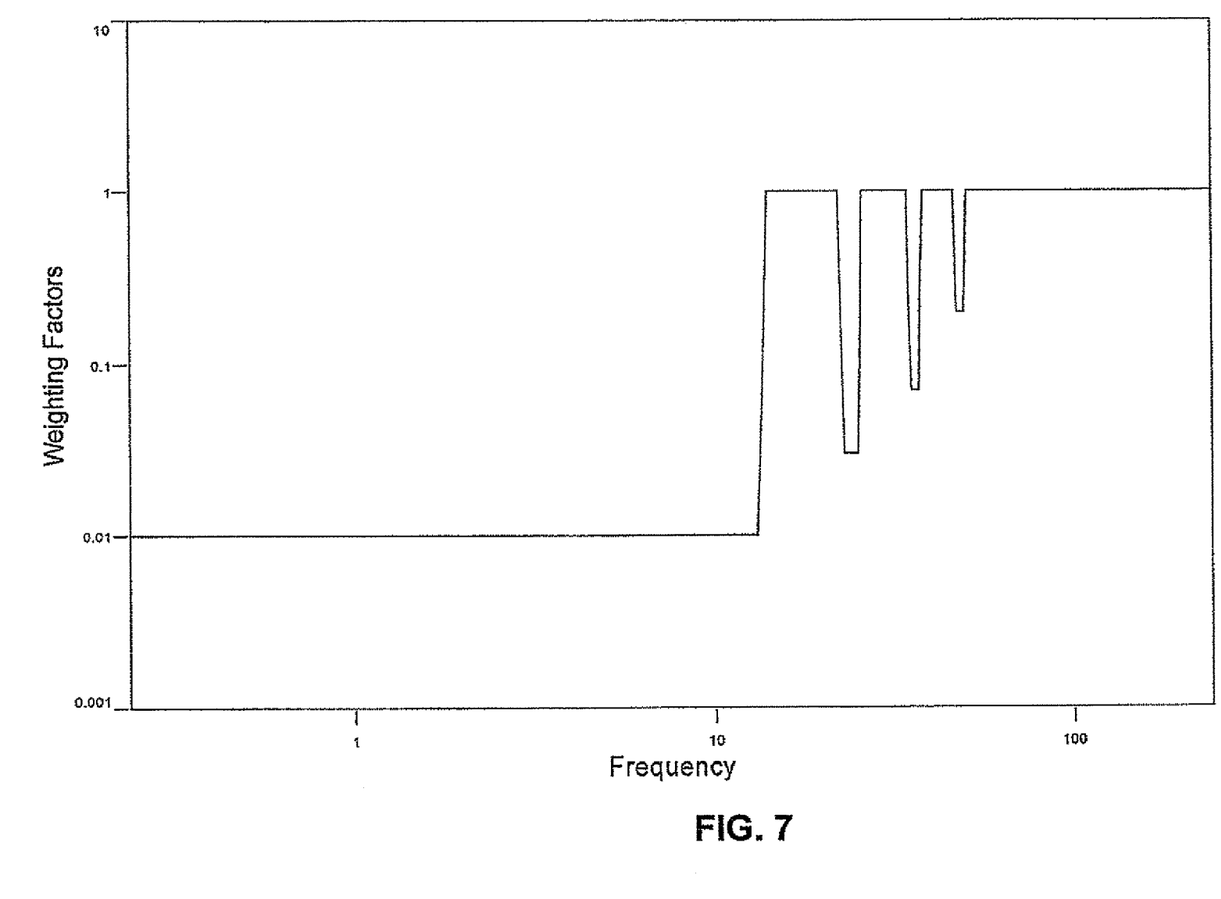
FIG. 7 is a graph of a single channel profile for a rock crusher.

Another example is described with reference to FIG. 7. Rock crushing machines include a feed rate at which rocks are fed into the hopper for crushing. The feed rate can vary depending upon the frequencies to which the rock crushing machine is exposed. Assume that a main crushing drum rotates at 120 rpm and is hexagonal in shape, which corresponds to a fundamental frequency of 12 Hz. Assume also that it is known that high accelerations at the fundamental frequency and the first few harmonics are not a concern. The weighted RMS profile of FIG. 7 can be used with the sensor 10 to monitor the status of the rock crushing machine. In FIG. 7, only a single channel profile is shown. Hypothetically, notches at the fundamental frequency and the first three harmonics are shown.

The above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method for monitoring an exposure of a system to a physical variable, the method comprising:
    A) periodically sensing the physical variable to produce a sequential digital data stream having a plurality of digital samples wherein the physical variable is acceleration;
    B) collecting a known number of digital samples in sequence from the sequential digital data stream to form a first time domain data group;
    C) applying a windowing function to the first time domain data group, the windowing function minimizing a difference between a value of a first digital sample of the first time domain data group and a value of a last digital sample of the first time domain data group;
    D) converting the digital samples in the first time domain data group to respective frequency domain representations in a frequency domain after applying the windowing function to the first time domain data group; and
    E) calculating the exposure of the system to the physical variable in the frequency domain using the frequency domain representations; wherein step A) is performed using an accelerometer sensing the acceleration in at least one direction.

2. The method according to claim 1, further comprising:
    producing the sequential digital data stream by converting each sensed value for the physical variable to a corresponding digital sample.

3. The method according to claim 1, further comprising:
    applying an application-specific weighting function to the frequency domain representations before calculating the exposure in the frequency domain, the application-specific weighting function dependent on the system being monitored.

4. The method according to claim 3 wherein applying the application-specific weighting function comprises applying a weighting factor to each of the frequency domain representations based on a fundamental frequency, the fundamental frequency resulting from normal operation of the system.

5. The method according to claim 1 wherein step B) comprises filling a first data window with a first plurality of digital samples in sequence while performing step A); and wherein step E) comprises calculating a first exposure in the frequency domain using the frequency domain representations of the digital samples in the first data window, the method further comprising:
    performing step B) to form a second time domain data group by filling a second data window with a second plurality of digital samples of the sequential digital data stream in sequence while performing at least one of steps C), D) and E) for the first time domain data group;
    performing steps C) and D) with second time domain data group in place of the first time domain data group; and
    calculating a second exposure in the frequency domain using the frequency domain representations of the digital samples in the second data window after calculating the first exposure; and wherein the first data window and the second data window hold a same number of digital samples.

6. The method according to claim 5, further comprising:
    calculating a recent exposure in the frequency domain by adding the first exposure and the second exposure.

7. The method according to claim 1 wherein step B) comprises filling a first data window with a first plurality of digital samples in sequence while performing step A); and wherein step E) comprises calculating a first exposure in the frequency domain using the frequency domain representations of the digital samples in the first data window, the method further comprising:
    performing step B) to start forming a second time domain data group by filling a first portion of a second data window with certain of the first plurality of digital samples occurring at an end of the first data window in sequence while performing step A);
    performing step B) to form a third time domain data group by filling a third data window with a second plurality of digital samples of the sequential digital data stream in sequence and collected after the first plurality of digital samples, the filling occurring while performing at least one of step A) and calculating the first exposure; and performing step B) to finish forming the second time domain data group by filling a second portion of the second data window with certain of the second plurality of digital samples occurring at a beginning of the second data window simultaneously with filling the third data window with the certain of the second plurality of digital samples.

8. The method according to claim 7, further comprising:
performing steps C) and D) with the second time domain data group in place of the first time domain data group; and
calculating a second exposure in the frequency domain using the frequency domain representations of the digital samples in the second data window after the second data window is filled and while performing at least one of steps B), C), and D) with the third time domain data group in place of the first time domain data group.

9. The method according to claim 7 wherein step C) comprises scaling each digital sample based on its position in the first time domain data group, the method further comprising:
performing step C) with at least one of the second time domain data group and the third time domain data group in place of the first data group.

10. The method according to claim 1 wherein calculating the exposure using the frequency domain representations further comprises:
calculating a plurality of exposure values in the frequency domain using the frequency domain representations;
counting occurrences where an individual value of the plurality of exposure values calculated in the frequency domain is outside a desired range; and
calculating a lifetime exposure using a count of the occurrences.

11. The method according to claim 1, further comprising:
outputting the exposure as a logic level or as a proportional analog value.

12. The method according to claim 1 wherein step D) comprises:
performing a Fourier transform on each of the digital samples of the first time domain data group to obtain a respective complex Fourier coefficient at a respective frequency; and
calibrating each complex Fourier coefficient using a calibration scalar to obtain the respective frequency domain representations.

13. A method for monitoring an exposure of a system to a physical variable, the method comprising:
periodically sensing the physical variable to produce a plurality of digital samples using an accelerometer sensing acceleration in at least one direction wherein the physical variable is the acceleration;
converting the plurality of digital samples to respective frequency domain representations;
calculating the exposure of the system to the physical variable using the frequency domain representations;
sequentially filling a plurality of windows with the plurality of digital signals;
calculating the exposure by calculating a first exposure value using frequency domain representations corresponding to digital signals of a first one of the plurality of windows; and
deciding whether to store at least one of the first exposure value and the digital signals of the first one of the plurality of windows based on the first exposure value.

14. The method according to claim 13, further comprising:
storing the digital signals of the first one of the plurality of windows in response to the first exposure value exceeding a preset level or the first exposure value being outside an envelope of values.

15. The method according to claim 13 wherein calculating the first exposure value comprises performing a correlation function on the frequency domain representations corresponding to the digital signals of the first one of the plurality of windows and a user-defined pattern, the method further including:
storing the digital signals of the first one of the plurality of windows in response to the first exposure value exceeding a preset level.

16. The method according to claim 13, further comprising:
calculating a second exposure value using frequency domain representations corresponding to digital signals of a second window of the plurality of windows;
comparing the second exposure value to the first exposure value;
deciding whether to store at least one of the second exposure value and data of the second window based on a result of the comparing.

17. The method according to claim 13, further comprising:
applying a windowing function to each of the plurality of windows, the windowing function minimizing a difference between a value of a first digital sample at a beginning of a respective window and a value of a last digital sample at an end of the respective window; and wherein converting the plurality of digital samples to respective frequency domain representations comprises converting data in the respective window after applying the windowing function to the respective window.

18. An apparatus for monitoring an exposure of a system to a physical variable, the apparatus comprising:
A) means for periodically sensing the physical variable to produce a sequential digital data stream having a plurality of digital samples;
B) means for collecting a known number of digital samples in sequence from the sequential digital data stream to form a first time domain data group;
C) means for applying a windowing function to the first time domain data group, the windowing function minimizing a difference between a value of a first digital sample of the first time domain data group and a value of a last digital sample of the first time domain data group;
D) means for converting the digital samples in the first time domain data group to respective frequency domain representations in a frequency domain after applying the windowing function to the first time domain data group; and
E) means for calculating the exposure of the system to the physical variable in the frequency domain using the frequency domain representations; wherein the physical variable is acceleration and wherein the means for periodically sensing the physical variable comprises:
an accelerometer sensing the acceleration in at least one direction; and
means for converting each sensed acceleration value to a corresponding digital sample.

19. The apparatus according to claim 18 wherein the means for calculating the exposure using the frequency domain representations comprises:
means for calculating, in the frequency domain, a first exposure in a first direction using frequency domain representations corresponding to a first plurality of digital samples;

means for calculating, in the frequency domain, a second exposure in a second direction using frequency domain representations corresponding to a second plurality of digital samples, the second direction different from the first direction;

means for calculating, in the frequency domain, a third exposure in a third direction using frequency domain representations corresponding to a third plurality of digital samples, the third direction different from the first direction and the second direction; and means for calculating a weighted exposure based on at least two of the first exposure, the second exposure and the third exposure.

20. The apparatus according to claim 18, further comprising:

means for scaling each of the frequency domain representations based on a fundamental frequency of the system before calculating the exposure, the fundamental frequency resulting from normal operation of the system.

21. The apparatus according to claim 18, further comprising:

F) memory including a plurality of windows for storing a same number of digital samples; wherein element B) includes means for filling a first data window with a first plurality of digital samples in sequence during a first time period; and wherein element E) includes means for calculating a first exposure in the frequency domain using the frequency domain representations of the first plurality of digital samples in the first data window;

G) means for collecting the known number of digital samples in sequence from the sequential digital data stream to form a second time domain data group by filling a first portion of a second data window with certain of the first plurality of digital samples occurring in sequence at an end of the first time period;

H) means for collecting the known number of digital samples in sequence from the sequential digital data stream to form a third time domain data group by filling a third data window with a second plurality of digital samples in sequence during a second time period after the first time period, the filling occurring while at least one of element A) is periodically sensing the physical variable, element G) is collecting the known number of digital samples and element E) is calculating the first exposure; wherein element G) further includes means for filling a second portion of the second data window with certain of the second plurality of digital samples occurring in sequence at a beginning of the second time period simultaneously with filling the third data window with the certain of the second plurality of digital samples;

I) means for applying the windowing function to the second time domain data group; and J) means for converting the digital samples in the second time domain data group to respective frequency domain representations in the frequency domain after applying the windowing function to the second time domain data group; and wherein element E) further includes means for calculating a second exposure in the frequency domain using frequency domain representations of the digital samples in the second data window while element H) is filling the third data window.

22. The apparatus according to claim 18 wherein the means for calculating the exposure further comprises means for calculating a plurality of exposure values using the frequency domain representations, the apparatus further comprising:

memory configured to store at least certain of the exposure values.

23. The apparatus according to claim 22 wherein the memory is further configured to store each of the exposure values over a predetermined time period as respective counts in a histogram.

* * * * *